US012356834B2

(12) United States Patent
Min et al.

(10) Patent No.: US 12,356,834 B2
(45) Date of Patent: Jul. 8, 2025

(54) ORGANIC LIGHT EMITTING DIODE DISPLAY DEVICE

(71) Applicant: LG Display Co., Ltd., Seoul (KR)

(72) Inventors: Keum-Kyu Min, Paju-si (KR);
Min-Geun Choi, Paju-si (KR);
Yong-Hoon Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 59 days.

(21) Appl. No.: 18/141,786

(22) Filed: May 1, 2023

(65) Prior Publication Data
US 2023/0269966 A1 Aug. 24, 2023

Related U.S. Application Data

(63) Continuation of application No. 17/116,560, filed on Dec. 9, 2020, now Pat. No. 11,665,927.

(30) Foreign Application Priority Data

Dec. 19, 2019 (KR) .......................... 10-2019-0171040

(51) Int. Cl.
*H10K 50/858* (2023.01)
*H10K 50/11* (2023.01)
(Continued)

(52) U.S. Cl.
CPC ....... *H10K 59/80521* (2023.02); *H10K 50/11* (2023.02); *H10K 50/813* (2023.02);
(Continued)

(58) Field of Classification Search
CPC .. H10K 50/858; H10K 59/124; H10K 59/122; H10K 50/813; H10K 50/822; H10K 59/879
See application file for complete search history.

(56) References Cited

U.S. PATENT DOCUMENTS 8,368,617 B2 * 2/2013 Asaki ................... H10K 50/852
345/82
9,991,320 B2 6/2018 Joung et al.
(Continued)

FOREIGN PATENT DOCUMENTS

EP 3 462 513 A1 4/2019
JP 2006-98638 A 4/2006
(Continued)

*Primary Examiner* — Vu A Vu
*Assistant Examiner* — Valerie N Newton
(74) *Attorney, Agent, or Firm* — Birch, Stewart, Kolasch & Birch, LLP

(57) ABSTRACT

An organic light emitting diode display device can include a substrate including at least one subpixel having a non-emitting area and an emitting area, a thin film transistor in the non-emitting area on the substrate, an overcoating layer on the thin film transistor and having a plurality of microlenses at a top surface of the overcoating layer, and a light emitting diode in the emitting area on the overcoating layer and connected to the thin film transistor. The surface of the plurality of microlenses can be divided into a plurality of convex portions and a plurality of concave portions with respect to a central surface. Further, the adjacent edge portions of adjacent two of the plurality of microlenses can constitute a first high portion, and the adjacent edge portions of adjacent three of the plurality of microlenses constitute a second high portion.

21 Claims, 14 Drawing Sheets

(51) Int. Cl.
  *H10K 50/813* (2023.01)
  *H10K 50/822* (2023.01)
  *H10K 59/124* (2023.01)
  *H10K 59/80* (2023.01)
  *H10K 59/122* (2023.01)
  *H10K 59/38* (2023.01)

(52) U.S. Cl.
  CPC ......... *H10K 50/822* (2023.02); *H10K 50/858* (2023.02); *H10K 59/124* (2023.02); *H10K 59/80515* (2023.02); *H10K 59/879* (2023.02); *H10K 59/122* (2023.02); *H10K 59/38* (2023.02); *H10K 59/8793* (2023.02)

(56) References Cited

U.S. PATENT DOCUMENTS

| | | |
|---|---|---|
| 2011/0233570 A1 | 9/2011 | Lee et al. |
| 2012/0057100 A1* | 3/2012 | Masuda .................. G02B 5/045 359/619 |
| 2014/0085865 A1* | 3/2014 | Yun ....................... G02B 3/0006 359/619 |
| 2017/0084676 A1* | 3/2017 | Jang ....................... H10K 59/38 |
| 2017/0125742 A1 | 5/2017 | Park et al. |
| 2018/0151842 A1 | 5/2018 | Park et al. |
| 2018/0175327 A1 | 6/2018 | Jang et al. |
| 2018/0247980 A1 | 8/2018 | Jang et al. |
| 2019/0006557 A1 | 1/2019 | Kim et al. |
| 2019/0006626 A1 | 1/2019 | Kim et al. |
| 2019/0103442 A1 | 4/2019 | Choi et al. |
| 2019/0189966 A1 | 6/2019 | Jang et al. |
| 2019/0363107 A1 | 11/2019 | Matsusaki et al. |

FOREIGN PATENT DOCUMENTS

| | | |
|---|---|---|
| JP | 2018-37391 A | 3/2018 |
| KR | 10-2016-0080834 A | 7/2016 |
| KR | 10-2017-0063297 A | 6/2017 |
| KR | 10-2018-0020091 A | 2/2018 |

* cited by examiner

Rp = 0.35 μm

Rp = 0.40 μm

Rp = 0.45 μm

Rp = 0.50 μm

Rp = 0.55 μm

Rp = 0.60 μm

Rp = 0.64 μm

Rp = 0.69 μm

ORGANIC LIGHT EMITTING DIODE DISPLAY DEVICE

CROSS REFERENCE TO RELATED APPLICATIONS

The present application is a Continuation Application of U.S. application Ser. No. 17/116,560, filed on Dec. 9, 2020, which claims the priority benefit of Korean Patent Application No. 10-2019-0171040 filed in the Republic of Korea on Dec. 19, 2019, the entire contents of all these applications being hereby expressly incorporated by reference into the present application.

BACKGROUND OF THE INVENTION

Field of the Invention

The present invention relates to an organic light emitting diode display device, and more particularly, to an organic light emitting diode display device where a light extraction efficiency is improved due to a microlens.

Discussion of the Related Art

Recently, with the advent of an information-oriented society and as the interest in information displays for processing and displaying a massive amount of information and the demand for portable information media have increased, a display field has rapidly advanced. Thus, various light and thin flat panel display devices have been developed and highlighted.

Among the various flat panel display devices, an organic light emitting diode (OLED) display device is an emissive type device and does not include a backlight unit used in a non-emissive type device such as a liquid crystal display (LCD) device. As a result, the OLED display device has a light weight and a thin profile.

In addition, the OLED display device has advantages of a viewing angle, a contrast ratio, and power consumption as compared with the LCD device. Furthermore, the OLED display device can be driven with a low direct current (DC) voltage and has rapid response speed. Moreover, since the inner elements of the OLED display device have a solid phase, the OLED display device has high durability against an external impact and has a wide available temperature range.

In an OLED display device according to the related art, while light emitted from a light emitting layer passes through various components and is emitted to an exterior, a large amount of the light can be lost. As a result, the light emitted to the exterior of the OLED display device can be 20% of the light emitted from the light emitting layer.

Since the amount of the light emitted from the light emitting layer is increased along with the amount of a current applied to the OLED display device, it is possible to further increase the luminance of the OLED display device by applying more currents to the light emitting layer. However, in that case, power consumption can be increased, and lifetime of the OLED display device can also reduced.

SUMMARY OF THE INVENTION

Accordingly, the present invention is directed to an organic light emitting diode display device that substantially obviates one or more of the problems due to limitations and disadvantages of the related art.

An object of the present invention is to provide an organic light emitting diode display device where a light extraction efficiency and a reliability are improved by adjusting a shape of a microlens using a maximum height of a plurality of high portions (i.e., relative maximum portions) in a sampling area.

Another object of the present invention is to provide an organic light emitting diode display device where a color difference is reduced and a stain is prevented by adjusting a shape of a microlens using a maximum height of a plurality of high portions (i.e., relative maximum portions) in a sampling area.

Additional features and advantages of the invention will be set forth in the description which follows, and in part will be apparent from the description, or can be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, an organic light emitting diode display device includes a substrate including at least one subpixel having a non-emitting area and an emitting area; a thin film transistor in the non-emitting area on the substrate; an overcoating layer on the thin film transistor and having a plurality of microlenses at a top surface of the overcoating layer (e.g. the microlenses formed by undulations in the overcoat layer); and a light emitting diode in the emitting area on the overcoating layer (e.g. at least partially on the area of the overcoat layer having the plurality of microlenses) and connected to the thin film transistor, wherein a surface of the plurality of microlenses in a sampling area of the emitting area is divided into a plurality of convex portions and a plurality of concave portions with respect to a central surface, wherein a total volume of the plurality of convex portions with respect to the central surface is equal to a total volume of the plurality of concave portions with respect to the central surface, and wherein a maximum peak which is a maximum value among heights of the plurality of convex portions with respect to the central surface is within a range of approximately 0.45 μm to 0.72 μm.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
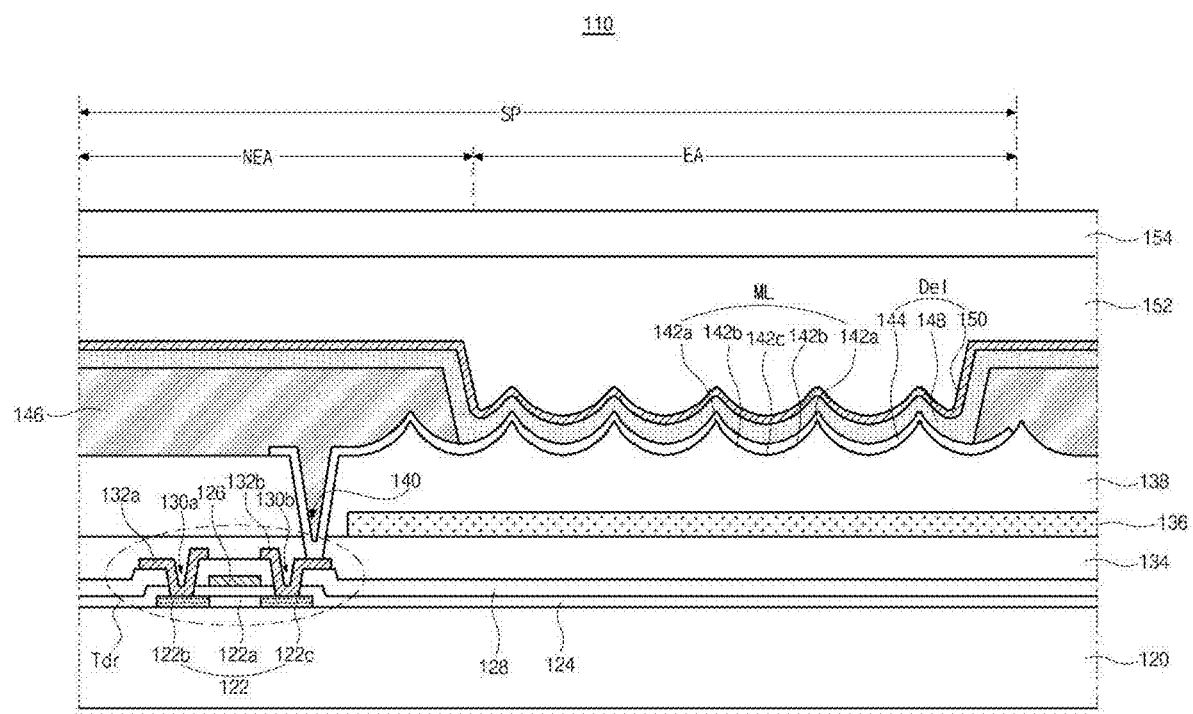
FIG. 1 is a cross-sectional view showing an organic light emitting diode display device according to a first embodiment of the present disclosure.

Reference will now be made in detail to embodiments of the present disclosure, examples of which can be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and can be changed as is known in the art, with the exception of steps and/or operations necessarily occurring in a particular order. Like reference numerals designate like elements throughout. Names of the respective elements used in the following explanations are selected only for convenience of writing the specification and can be thus different from those used in actual products.

Advantages and features of the present disclosure, and implementation methods thereof will be clarified through following example embodiments described with reference to the accompanying drawings. The present disclosure can, however, be embodied in different forms and should not be construed as limited to the example embodiments set forth herein. Rather, these example embodiments are provided so that this disclosure can be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration can be omitted. In a case where terms "comprise," "have," and "include" described in the present specification are used, another part can be added unless a more limiting term, such as "only," is used. The terms of a singular form can include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts can be disposed between the two parts unless a more limiting term, such as "just" or "direct(ly)," is used.

In describing a time relationship, when the temporal order is described as, for example, "after," "subsequent," "next," or "before," a case which is not continuous can be included unless a more limiting term, such as "just," "immediate(ly)," or "direct(ly)," is used.

It will be understood that, although the terms "first," "second," etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" can be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer may not only be directly connected, coupled or adhered to that other element or layer, but also be indirectly connected, coupled or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure can be partially or overall coupled to or combined with each other, and can be variously inter-operated with each other and driven technically as those skilled in the art can sufficiently understand. Embodiments of the present disclosure can be carried out independently from each other, or can be carried out together in co-dependent relationship.

Reference will now be made in detail to the present disclosure, examples of which are illustrated in the accompanying drawings.

FIG. 1 is a cross-sectional view showing an organic light emitting diode display device according to a first embodiment of the present disclosure.

In FIG. 1, an organic light emitting diode (OLED) display device 110 can have a top emission type or a bottom emission type according to an emission direction of a light. A bottom emission type OLED display device 110 is exemplarily illustrated hereinafter.

The OLED display device 110 includes a substrate 120, a driving thin film transistor (TFT) Tdr and a light emitting diode Del.

The OLED display device 110 can further include a switching TFT, a sensing TFT and a storage capacitor. The switching TFT and the sensing TFT can have the same structure as the driving TFT Tdr.

The substrate 120 includes a plurality of subpixels SP. Each subpixel SP has an emitting area EA where the light emitting diode Del is disposed and a non-emitting area NEA where the driving TFT Tdr is disposed.

The substrate 120 can include a glass or a plastic such as polyimide.

A semiconductor layer 122 is disposed in the non-emitting area NEA on the substrate 120. The semiconductor layer 122 has an active region 122a as a channel and drain and source regions 122b and 122c at both sides of the active region 122a.

The active region 122a can include an intrinsic polycrystalline silicon and the drain and source regions 122b and 122c can include an impurity doped polycrystalline silicon.

In another embodiment, a light shielding layer can be disposed under the semiconductor layer 122 for minimizing variance of a threshold voltage due to an external light.

A gate insulating layer 124 is disposed on a whole of the substrate 120 having the semiconductor layer 122, and a gate electrode 126 is disposed on the gate insulating layer 124 over the active region 122a.

A gate line connected to a gate electrode of the switching TFT can be disposed on the gate insulating layer 124.

An interlayer insulating layer 128 is disposed on a whole of the substrate 120 having the gate electrode 126, and drain and source electrodes 132a and 132b are disposed on the interlayer insulating layer 128 over the drain and source regions 122b and 122c, respectively.

A data line crossing the gate line to define each subpixel SP and connected to a source electrode of the switching TFT can be disposed on the interlayer insulating layer 128.

The interlayer insulating layer 128 and the gate insulating layer 124 include first and second contact holes 130a and 130b exposing the drain and source regions 122b and 122c, respectively. The drain and source electrodes 132a and 132b are connected to the drain and source regions 122b and 122c through the first and second contact holes 130a and 130b, respectively.

The semiconductor layer 122, the gate electrode 126, the drain electrode 132a and the source electrode 132b constitute the driving TFT Tdr.

Although the driving TFT Tdr exemplarily has a top gate type of a polycrystalline silicon in the first embodiment, the driving TFT Tdr can include an amorphous silicon or an oxide semiconductor and can have a bottom gate type in another embodiment.

A passivation layer 134 is disposed on a whole of the substrate 120 having the driving TFT Tdr, and a wavelength converting layer 136 is disposed in the emitting area EA on the passivation layer 134.

The wavelength converting layer 136 can include a color filter layer selectively transmitting a light of a wavelength corresponding to a predetermined color among a white light emitted from the light emitting diode Del to the substrate 120.

For example, the plurality of subpixels SP can include red, green, blue and white subpixels SP, and the red, green and blue subpixels SP can include red, green and blue color filter layers, respectively, as the wavelength converting layer 136.

In addition, the wavelength converting layer 136 can include a quantum dot (QD) emitting a light of a wavelength corresponding to a predetermined color by a re-emission according to a white light emitted from the light emitting diode Del to the substrate 120.

For example, the quantum dot can include at least one selected from a group including CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, InAlPAs and SbTe.

For example, the wavelength converting layer 136 of the red subpixel SP can include a quantum dot of CdSe or InP, the wavelength converting layer 136 of the green subpixel SP can include a quantum dot of CdZnSeS, and the wavelength converting layer 136 of the blue subpixel SP can include a quantum dot of ZnSe.

The wavelength converting layer 136 can include a color filter layer containing a quantum dot.

An overcoating layer 138 is disposed on a whole of the substrate 120 having the wavelength converting layer 136. The overcoating layer 138 and the passivation layer 134 includes a third contact hole 140 exposing the source electrode 132b.

A first high portion (i.e., a first relative maximum portion) 142a having a relatively great height, a low portion (i.e., a relative minimum portion) 142c having a relatively small height and a slanting portion 142b between the first relative maximum portion 142a and the relative minimum portion 142c are disposed in a top surface of the overcoating layer 138. The relative minimum portion 142c at a center, the slanting portion 142b at both sides of the relative minimum portion 142c and the first relative maximum portion 142a at both sides of the slanting portion 142b constitute a unit microlens ML.

The overcoating layer 138 can include an insulating material having a refractive index of 1.5. For example, the overcoating layer 138 can include one of acrylic resin, epoxy resin, phenol resin, polyamide resin, polyimide resin, unsaturated polyester resin, polyphenylene resin, polyphenylenesulfide resin, benzocyclobutene and photoresist.

A first electrode 144 is disposed in the emitting area EA on the overcoating layer 138. The first electrode 144 can be connected to the source electrode 132b through the third contact hole 140.

For example, the first electrode 144 can be an anode including a material having a relatively high work function.

A bank layer 146 is disposed in the non-emitting area NEA on the first electrode 144. The bank layer 146 covers a boundary of the first electrode 144 and includes an opening exposing a central portion of the first electrode 144.

The first relative maximum portion 142a, the slanting portion 142b and the relative minimum portion 142c constituting the microlens ML are disposed in a whole of the opening of the bank layer 146. For example, the first relative maximum portion 142a, the slanting portion 142b and the relative minimum portion 142c of the microlens ML can contact an edge portion of the bank layer 146 adjacent to the opening.

The opening of the bank layer 146 can be disposed to correspond to the wavelength converting layer 136. Stated differently, the opening of the bank layer 146 can be disposed to directly overlie the wavelength converting layer 136. For example, the edge portion of the bank layer 146 can overlap with an edge portion of the wavelength converting layer 136. Since at least a portion of the wavelength converting layer 136 overlaps the bank layer 146, a leakage of a light not passing through the wavelength converting layer 136 is minimized.

A light emitting layer 148 is disposed on a whole of the substrate 120 having the first electrode 144. The light emitting layer 148 can have a single layer of an emitting material. Alternatively, the light emitting layer 148 can have a multiple layer including a hole injecting layer (HIL), a hole transporting layer (HTL), an emitting material layer (EML), an electron transporting layer (ETL) and an electron injecting layer (EIL).

A second electrode 150 is disposed on a whole of the substrate 120 having the light emitting layer 148. For example, the second electrode 150 can be a cathode including a material having a relatively low work function.

The first electrode 144, the light emitting layer 148 and the second electrode 150 constitute a light emitting diode Del.

Since the first electrode 144, the light emitting layer 148 and the second electrode 150 are disposed on the overcoating layer 138 according to a shape of the first relative maximum portion 142a, the slanting portion 142b and the relative minimum portion 142c, the first electrode 144, the light emitting layer 148 and the second electrode 150 have a shape of a microlens ML.

A face seal 152 is disposed on the light emitting diode Del, and a protecting film 154 is disposed on the face seal 152. The face seal 152 can include an organic insulating material or an inorganic insulating material that is transparent and has an adhesive property. The protecting film 154 can has a thin film type.

To prevent penetration of an external oxygen and a moisture into an interior of the light emitting diode Del, the protecting film 154 can include at least two inorganic protecting films. Further, an organic protecting film for supplementing impact resistance of the at least two inorganic protecting films can be interposed between the at least two inorganic protecting films.

In the structure where the organic protecting film and the inorganic protecting film are alternately laminated with each other, the inorganic protecting film can completely wrap the organic protecting film such that penetration of the moisture and the oxygen through a side surface of the organic protecting film is prevented.

To minimize reflection of an external light, a retardation plate and a polarizing plate can be disposed under the substrate 120.

In the OLED display device 110 according to the first embodiment of the present disclosure, when a voltage is applied to the first and second electrodes 144 and 150, a hole injected from the first electrode 144 and an electron injected from the second electrode 150 are transmitted to the light emitting layer 148 to constitute an exciton. When the exciton transitions from an excited state to a ground state, a light can be emitted from the light emitting layer 148.

The light of the light emitting layer 148 can pass through the transparent first electrode 144 to be emitted toward an exterior such that an image is displayed.

Since the overcoating layer 138, the first electrode 144, the light emitting layer 148 and the second electrode 150 constitute the microlens ML, the light confined in the interior of the light emitting layer 148 due to a total reflection can be transmitted with an angle smaller than a critical angle of the total reflection by the microlens ML to be extracted to the exterior through the substrate 120. As a result, the light extraction efficiency of the OLED display device 110 is improved.

In addition, since the microlens ML of the overcoating layer 138, the first electrode 144, the light emitting layer 148 and the second electrode 150 is disposed in a whole of the opening of the bank layer 146 corresponding to the emitting area EA, the whole of the emitting area EA is used for the microlens ML and the light extraction efficiency is maximized.

Figure 2:
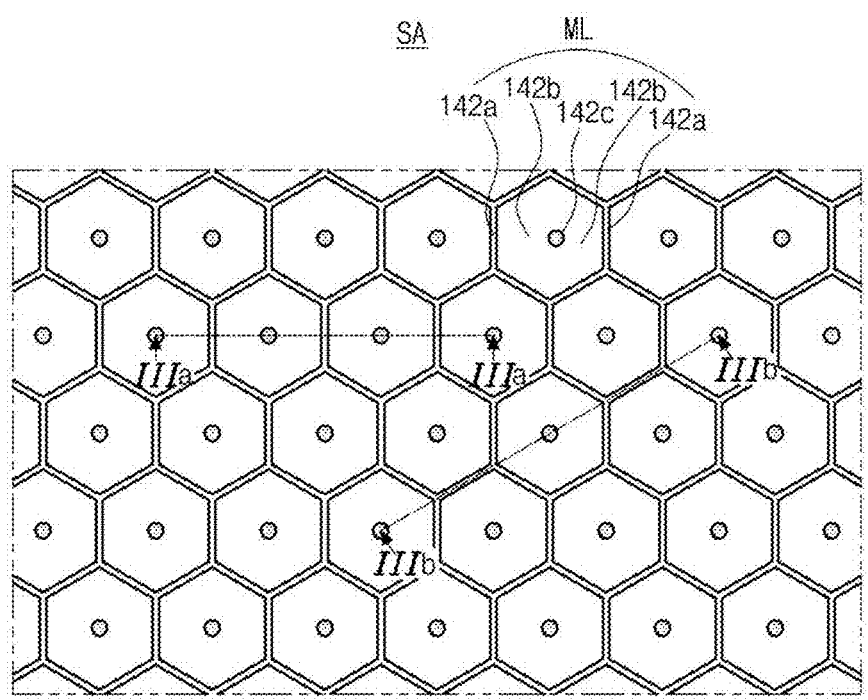
FIG. 2 is a plan view showing a sampling area of an organic light emitting diode display device according to the first embodiment of the present disclosure.
Figure 3A:
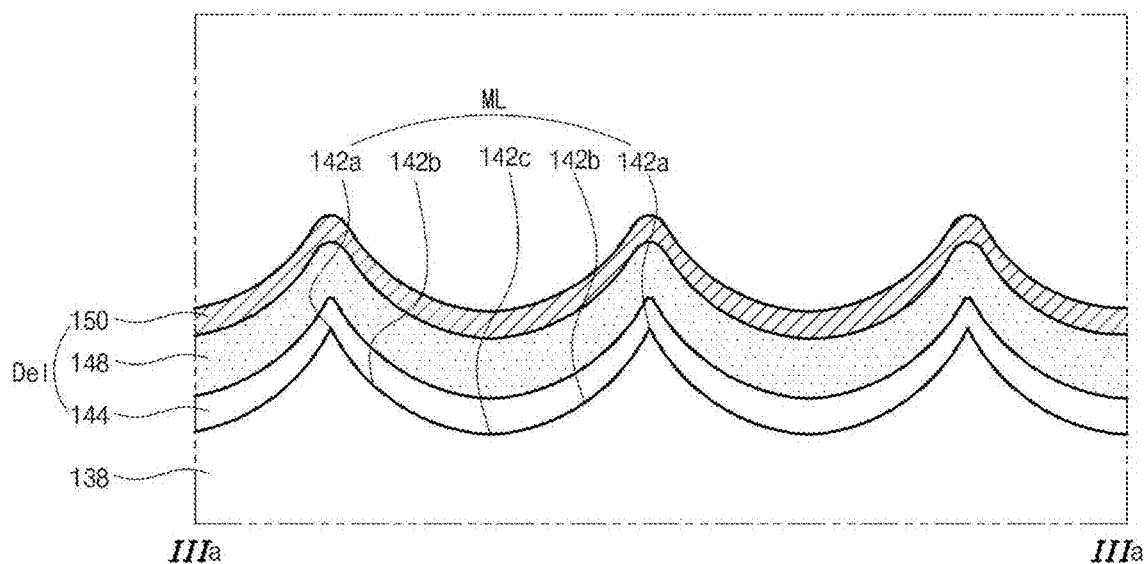
FIG. 3A is a cross-sectional view taken along a line IIIa-IIIa of FIG. 2.
Figure 3B:
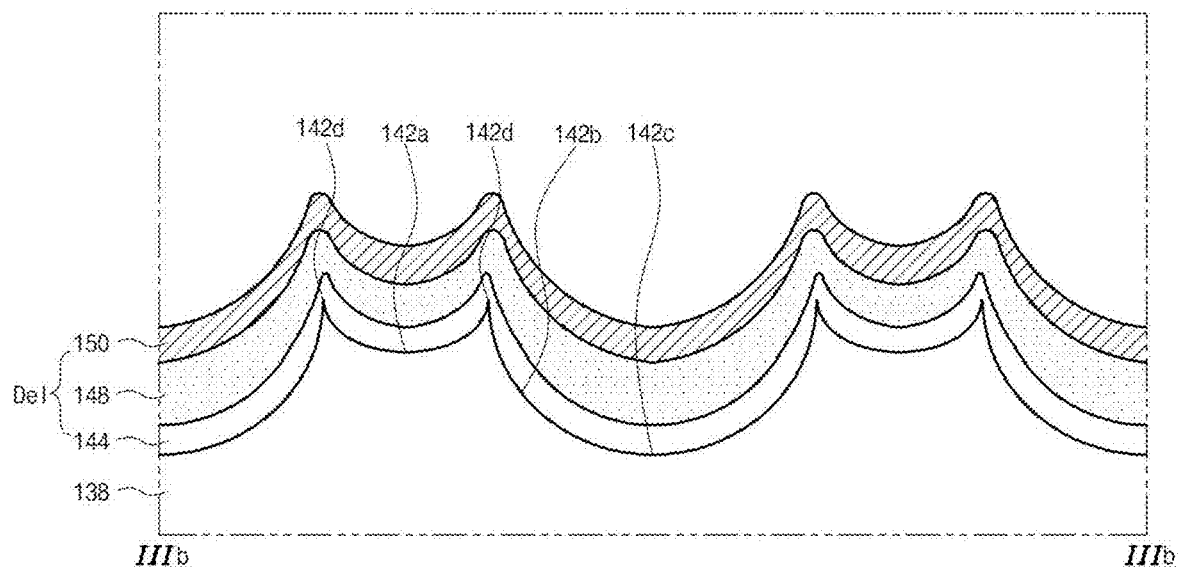
FIG. 3B is a cross-sectional view taken along a line IIIb-IIIb of FIG. 2.

FIG. 2 is a plan view showing a sampling area of an organic light emitting diode display device according to the first embodiment of the present disclosure. FIG. 3A is a cross-sectional view taken along a line IIIa-IIIa of FIG. 2, and FIG. 3B is a cross-sectional view taken along a line of FIG. 2.

In FIG. 2, a sampling area of the OLED display device 110 according to the first embodiment of the present disclosure includes a plurality of microlenses ML having a hexagonal honeycomb structure in a plan view.

In another embodiment, the plurality of microlenses ML can have various shapes such as a half circular shape, a half elliptical shape and a rectangular shape.

The plurality of microlenses ML of a hexagonal shape are disposed in one line along a horizontal direction (e.g., first direction) and are staggered along a vertical direction (e.g., second direction) and a diagonal direction (e.g., third direction).

One microlens ML includes a relative minimum portion 142c of a circular shape at a center, a slanting portion 142b at both sides of the relative minimum portion 142c and a first relative maximum portion 142a of a hexagonal shape at both sides of the slanting portion 142b.

In FIG. 3A showing four microlenses ML adjacent to each other along a horizontal direction, a portion where two microlenses ML of the overcoating layer 138 are disposed adjacent to each other constitutes the first relative maximum portion 142a, a central portion of the microlens ML constitutes the relative minimum portion 142c, and a portion between the first relative maximum portion 142a and the relative minimum portion 142c constitutes the slanting portion 142b.

The first electrode 144, the light emitting layer 148 and the second electrode 150 on the overcoating layer 138 are formed to have the same shape as the first relative maximum portion 142a, the slanting portion 142b and the relative minimum portion 142c of the microlens ML of the overcoating layer 138.

An angle between a tangential line of the slanting portion 142b and a horizontal surface (such as the aforementioned reference plane) can be within a range of about 20 degrees to 60 degrees.

When the angle between a tangential line of the slanting portion 142b and a horizontal surface smaller than about 20 degrees, a transmission angle of the light in the light emitting layer 148 having the microlens ML is not greatly changed as compared with a transmission angle of the light in a flat light emitting layer. As a result, a light extraction efficiency is insufficiently improved.

When the angle between a tangential line of the slanting portion 142b and a horizontal surface is greater than about 60 degrees, a transmission angle of the light in the light emitting layer 148 becomes greater than a critical angle of a total reflection at an interface of the substrate 120 (of FIG. 1) and an external air layer. As a result, an amount of the light confined in the OLED display device 110 increases and a light extraction efficiency of the light emitting layer 148 having the microlens ML decreases as compared with a light extraction efficiency of a flat light emitting layer.

In FIG. 3B showing three microlenses ML adjacent to each other along a diagonal direction, a portion where two microlenses ML of the overcoating layer 138 are disposed adjacent to each other constitutes the first relative maximum portion 142a, a central portion of the microlens ML constitutes the relative minimum portion 142c, and a portion between the first relative maximum portion 142a and the relative minimum portion 142c constitutes the slanting portion 142b. In addition, a portion where three microlenses ML of the overcoating layer 138 are disposed adjacent to each other constitutes a second high portion (i.e., a second relative maximum portion) 142d.

The second relative maximum portion 142d can have a height greater than the first relative maximum portion 142a.

The first electrode 144, the light emitting layer 148 and the second electrode 150 on the overcoating layer 138 are formed to have the same shape as the first relative maximum portion 142a, the slanting portion 142b, the relative minimum portion 142c and the second relative maximum portion 142d of the microlens ML of the overcoating layer 138.

In the OLED display device 110 according to the first embodiment of the present disclosure, the microlens ML is formed in the overcoating layer 138, the first electrode 144, the light emitting layer 148 and the second electrode 150, and the transmission path of the light confined in the interior of the light emitting layer 148 due to a total reflection is changed toward the substrate 120. As a result, the light extraction efficiency of the OLED display device 110 is improved.

In the sampling area of the OLED display device 110, a shape of the microlens ML can be controlled using a central surface CS and a maximum peak Rp calculated from the plurality of first relative maximum portions 142a, the plurality of slanting portions 142b, the plurality of relative minimum portions 142c and the plurality of second relative maximum portions 142d.

Figure 4:
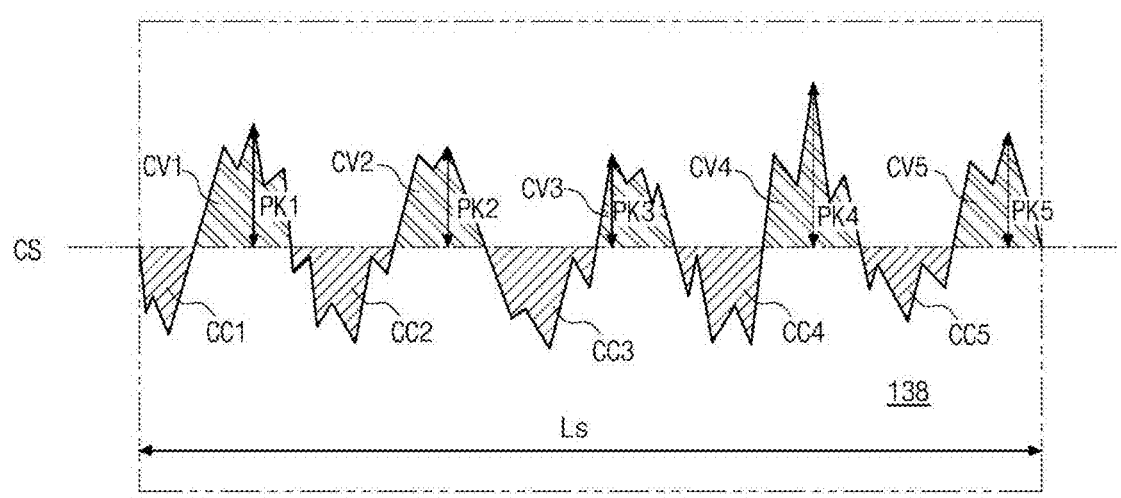
FIG. 4 is a cross-sectional view showing a sampling area of an organic light emitting diode display device according to the first embodiment of the present disclosure.
Figure 5A:
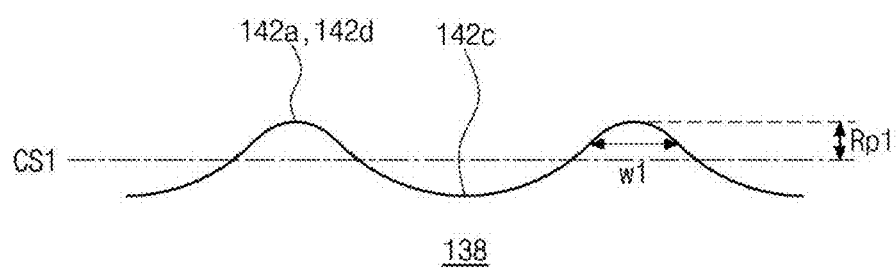
FIGS. 5A and 5B are cross-sectional views showing central surfaces of first and second samples, respectively, of an organic light emitting diode display device according to the first embodiment of the present disclosure.
Figure 5B:
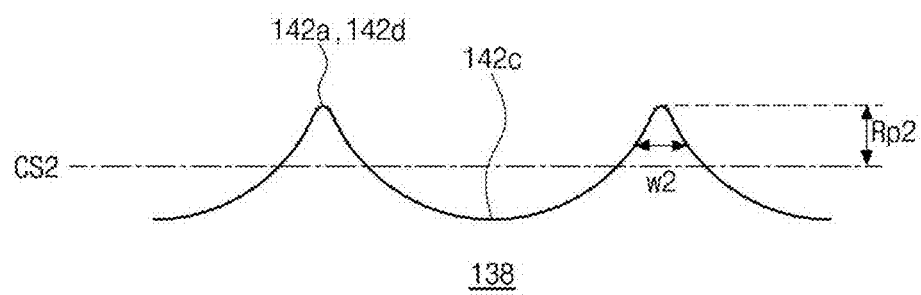
Figure 6A:
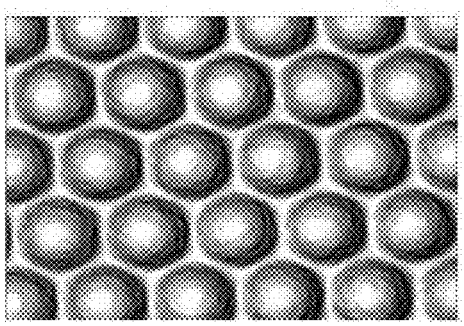
FIGS. 6A to 6H are plan views and perspective views showing a change of a shape of a plurality of microlenses with respect to a maximum peak of an organic light emitting diode display device according to the first embodiment of the present disclosure.
Figure 6A:
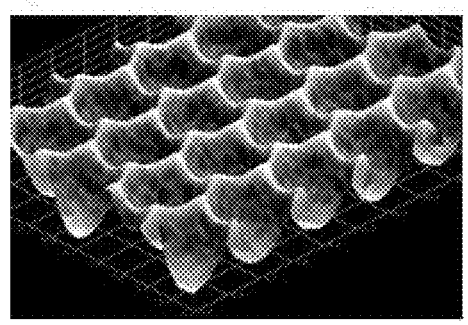
Figure 6B:
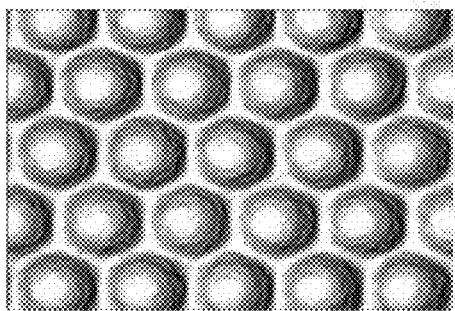
Figure 6B:
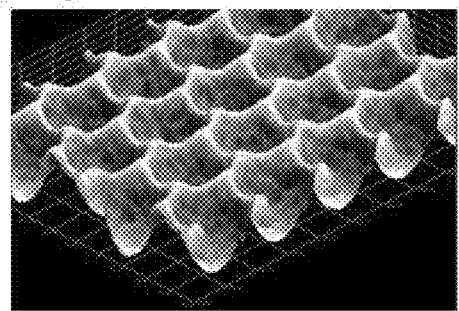
Figure 6C:
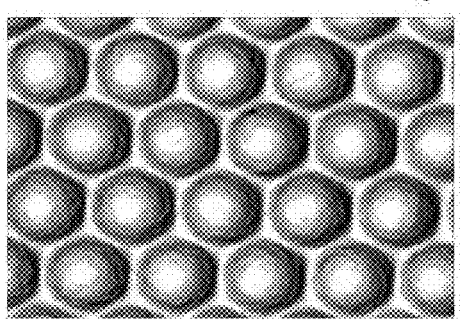
Figure 6C:
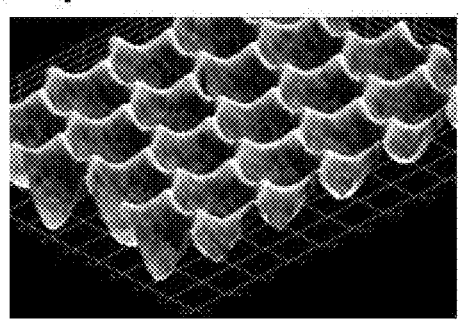
Figure 6D:
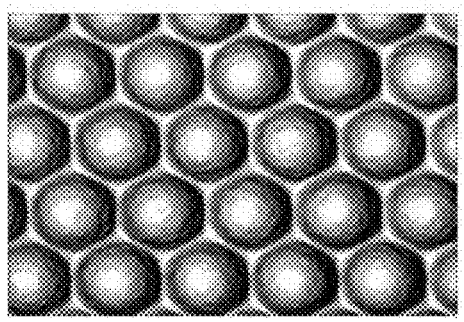
Figure 6D:
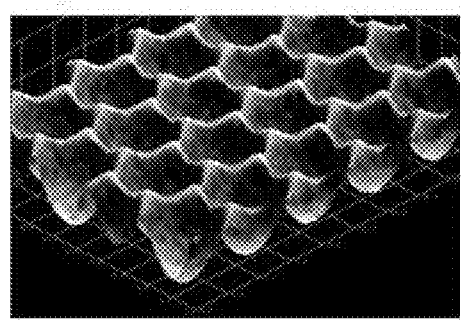
Figure 6E:
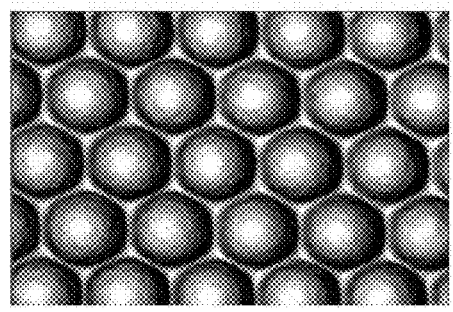
Figure 6E:
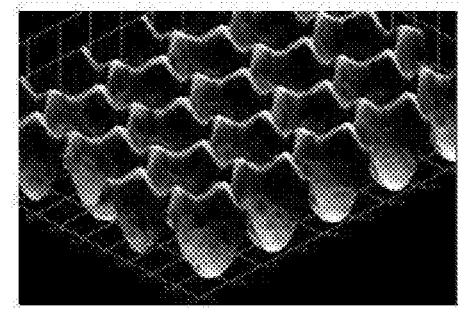
Figure 6F:
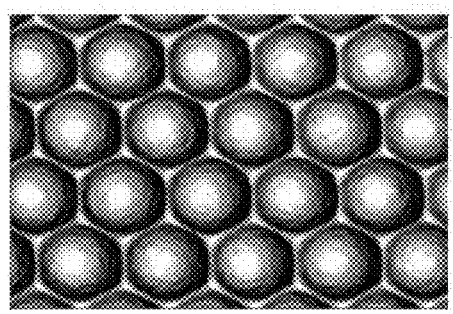
Figure 6F:
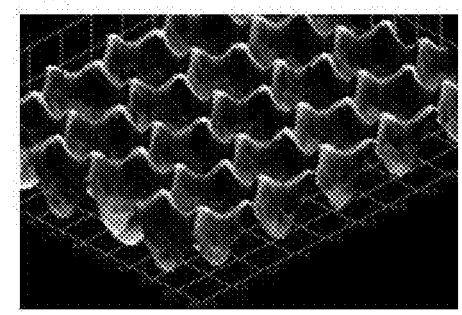
Figure 6G:
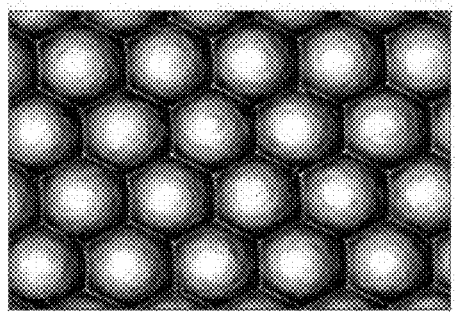
Figure 6G:
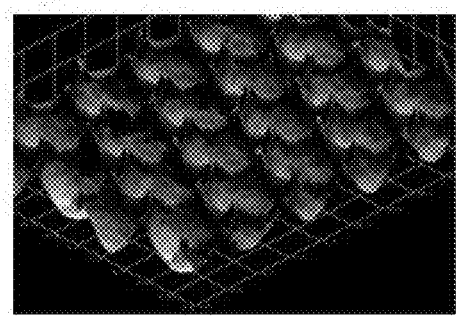
Figure 6H:
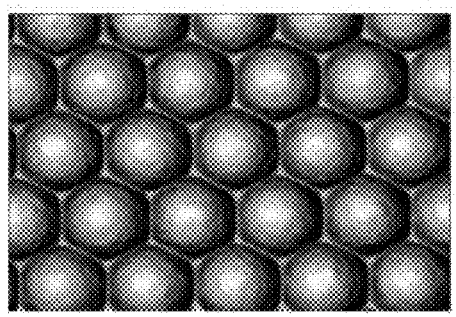
Figure 6H:
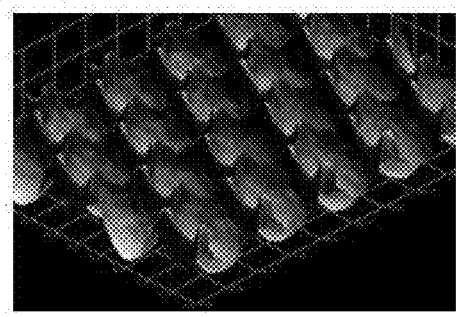

FIG. 4 is a cross-sectional view showing a sampling area of an organic light emitting diode display device according to the first embodiment of the present disclosure, and FIGS. 5A and 5B are cross-sectional views showing central surfaces of first and second samples, respectively, of the organic light emitting diode display device according to the first embodiment of the present disclosure.

In FIG. 4, the plurality of microlenses ML of the overcoating layer 138 on a sampling length Ls along one direction of a sampling area SA are measured to be expressed as a first convex portion CV1, a second convex portion CV2, a third convex portion CV3, a fourth convex portion CV4 and a fifth convex portion CV5 and a first concave portion CC1, a second concave portion CC2, a third concave portion CC3, a fourth concave portion CC4 and a fifth concave portion CC5. A line where a total area of the first to fifth convex portions CV1 to CV5 and a total area of the first to fifth concave portions CC1 to CC5 become the same as each other can be defined as a central line.

As a result, a line where an integral value of a function representing the top surface of the plurality of microlenses ML of the overcoating layer 138 becomes 0 can be defined as the central line.

The central line in a two-dimension can be extended as a central surface in a three-dimension. The plurality of microlenses ML of the overcoating layer 138 in a sampling area SA (a sub-area of the overcoating layer) are measured to obtain a function representing the top surface of the plurality of microlenses ML, and a surface where a total volume of a plurality of convex portions above the central surface and a total volume of a plurality of concave portions below the central surface become the same as each other can be defined as a central surface CS. The central surface is a virtual reference plane. The reference plane may lie parallel to the plane of the substrate or at an acute angle to the plane of the substrate such that a normal of the reference plane points away from the substrate in a direction toward the viewer (e.g. outward from the display surface within a viewer angle). The volume of the plurality of convex portions above the reference plane may be counted as the volume of the overcoat layer forming the convex portions, whereas the volume of the plurality of concave portions below the reference plane may be counted as the volume of the space between the reference plane and the overcoat layer.

Distances from the central surface CS to the first or second relative maximum portions 142a or 142d of the first to fifth convex portions CV1 to CV5 can be defined as first to fifth peaks PK1 to PK5, and a shape of the microlens ML can be controlled using a maximum peak Rp which is a maximum value among the first to fifth peaks PK1 to PK5.

In FIG. 5A, a first sample of the OLED display device according to the first embodiment of the present disclosure includes first and second relative maximum portions 142a and 142d and a relative minimum portion 142c. Since the first and second relative maximum portions 142a and 142d have a first width w1 of a relatively great value, the first sample has a first central surface CS1 of a relatively great height and a first maximum peak Rp1 of a relatively small value.

In FIG. 5B, a second sample of the OLED display device according to the first embodiment of the present disclosure includes first and second relative maximum portions 142a and 142d and a relative minimum portion 142c. Since the first and second relative maximum portions 142a and 142d have a second width w2 of a relatively small value, the second sample has a second central surface CS2 of a relatively small height and a second maximum peak Rp2 of a relatively great value.

When the first and second relative maximum portions 142a and 142d of the microlens ML has a round shape, the central surface CS rises and the maximum peak Rp decreases. When the first and second relative maximum portions 142a and 142d of the microlens ML has a sharp shape, the central surface CS falls and the maximum peak Rp increases.

As a result, the shape of the microlens ML can be controlled by using the maximum peak Rp with respect to the central surface CS, and the light extraction efficiency is improved.

In addition, since the central surface CS and the maximum peak Rp are calculated from a plurality of points of the plurality of microlenses ML of the sampling area SA, a data reliability is improved.

Figure 7:
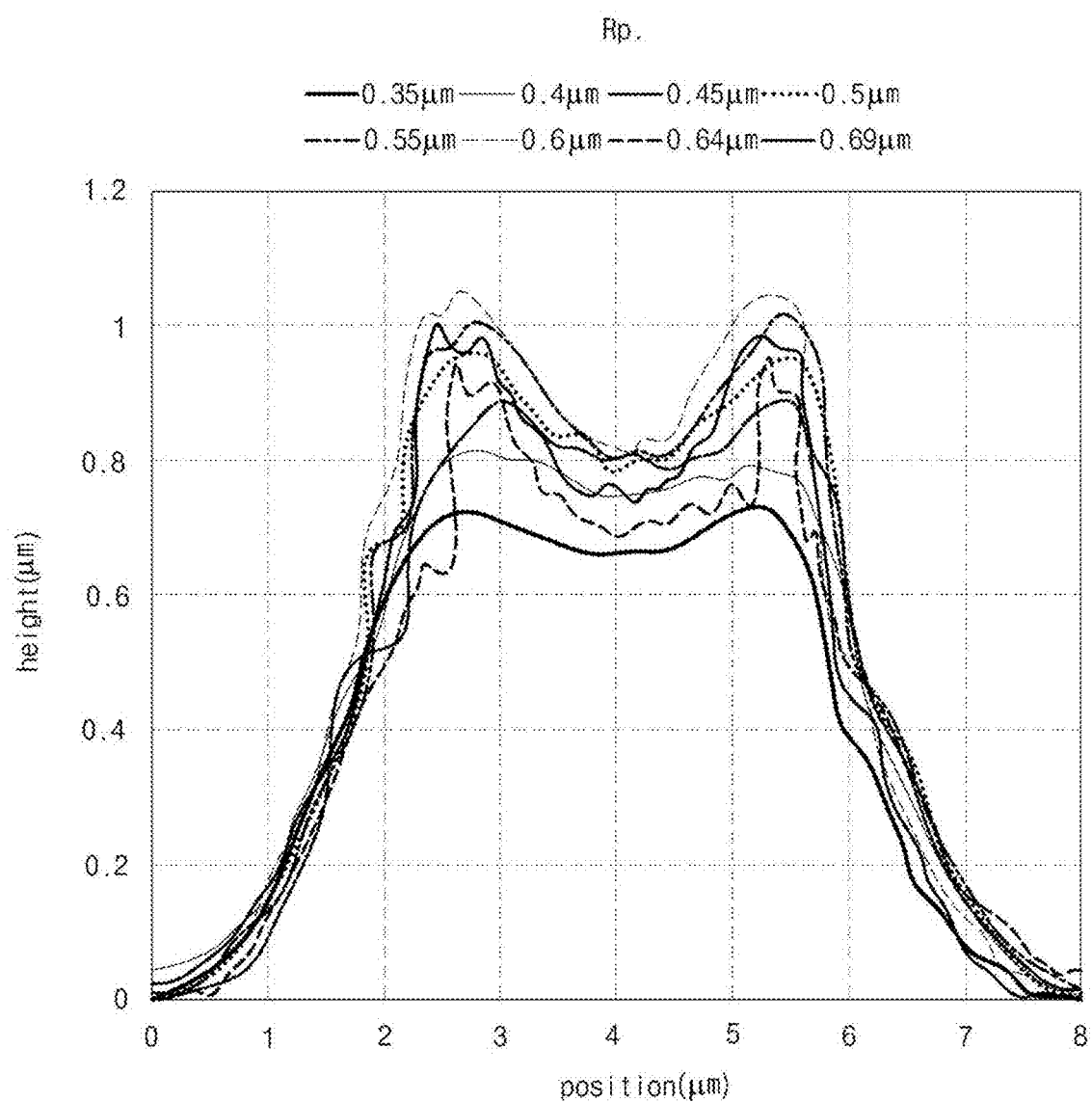
FIG. 7 is a cross-sectional view showing a change of a shape of four microlenses adjacent to a maximum peak of an organic light emitting diode display device according to the first embodiment of the present disclosure.

FIGS. 6A to 6H are plan views and perspective views showing a change of a shape of a plurality of microlenses with respect to a maximum peak of an organic light emitting diode display device according to the first embodiment of the present disclosure, and FIG. 7 is a cross-sectional view showing a change of a shape of four microlenses adjacent to a maximum peak of an organic light emitting diode display device according to the first embodiment of the present disclosure.

In FIGS. 6A to 6H and 7, as the maximum peak Rp increases from about 0.35 μm to about 0.69 μm through about 0.40 μm, about 0.45 μm, about 0.50 μm, about 0.55 μm, about 0.60 μm and about 0.64 μm, a width of the first and second relative maximum portions 142a and 142d gradually decreases and the first and second relative maximum portions 142a and 142d is changed from a round shape to a sharp shape.

A color difference of the OLED display device can be controlled using the maximum peak Rp.

Figure 8:
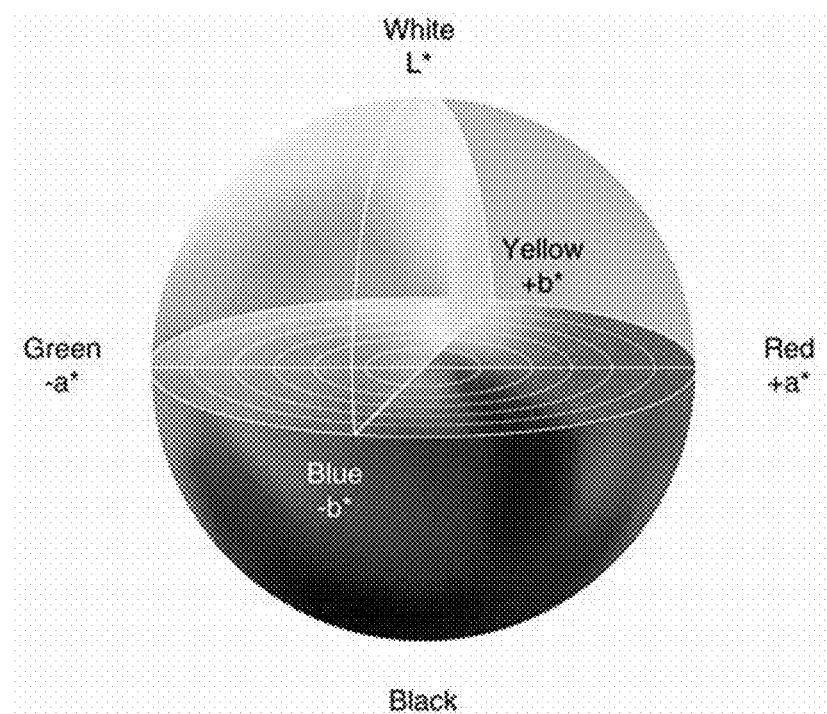
FIG. 8 is a CIE 1976 L*a*b* color coordinate showing a color difference of an organic light emitting diode according to the first embodiment of the present disclosure.

FIG. 8 is a CIE 1976 L*a*b* color coordinate showing a color difference of an organic light emitting diode according to the first embodiment of the present disclosure.

In FIG. 8, a CIE 1976 L*a*b* color coordinate is defined as a relative value with respect to a white color of a CIE 1931 XYZ color coordinate and includes all color ranges which RGB or CMYK can express. The CIE 1976 L*a*b* color coordinate can include a color which a human cannot recognize.

Differently from the RGB or CMYK, the CIE 1976 L*a*b* color coordinate is independent of a medium. Specifically, an L value of a lightness axis corresponds to a brightness (luminance, intensity) which a human feels.

In the CIE 1976 L*a*b* color coordinate, positive and negative maximum values of an L-axis represent white and black colors, respectively. Positive and negative maximum values of an a-axis represent red and green colors, respectively, and positive and negative maximum values of a b-axis represent yellow and blue colors, respectively.

In the CIE 1931 XYZ color coordinate, it is hard to express a uniform color difference with respect to a distance. In a CIE u'v' color coordinate, although a color management is possible, it is hard to manage a brightness. In the CIE 1976 L*a*b* color coordinate, a color management according to a brightness (i.e., a color difference management) is possible.

Indexes of each axis of the CIE 1976 L*a*b* color coordinate can be calculated from indexes of each axis of the CIE 1931 XYZ color coordinate according to following equations.

$$L^* = 116(Y/Yn)^{1/3} - 16$$

$$a^* = 500\{(X/Xn)^{1/3} - (Y/Yn)^{1/3}\}$$

$$b^* = 200\{(Y/Yn)^{1/3} - (Z/Zn)^{1/3}\}$$

$$L^*_m = 903.3(Y/Yn) \text{ for } Y/Yn \leq 0.008856$$

$$a^*_m = 500\{f(X/Xn) - f(Y/Yn)\}$$

$$b^*_m = 200\{f(Y/Yn) - f(Z/Zn)\}$$

In the CIE 1976 L*a*b* color coordinate, a color difference $\Delta E^*ab$ can be calculated from a difference between the indexes of each axis according to following color difference equations.

$$\Delta E^*_{ab} = \{(L^*_2 - L^*_1)^2 + (a^*_2 - a^*_1)^2 + (b^*_2 - b^*_1)^2\}^{1/2}$$

$\Delta E^*_{ab} \approx 2.3$ corresponds to a JND (just noticeable difference)

For example, when the color difference $\Delta E^*_{ab}$ is within a range of about 0 to about 0.2, it is impossible to measure two colors. Two colors of the color difference $\Delta E^*_{ab}$ within a range of about 0.2 to about 0.3 are recognized as nearly the same color. The color difference $\Delta E^*_{ab}$ within a range of about 0.3 to about 0.6 are accepted as a practical color difference. When two colors of the color difference $\Delta E^*_{ab}$ within a range of about 0.6 to about 1.2 are measured in an enumeration state, two colors are recognized as the same color. When two colors of the color difference $\Delta E^*_{ab}$ within a range of about 1.2 to about 2.5 are measured in a division state, two colors are recognized as the same color. When two colors of the color difference $\Delta E^*_{ab}$ within a range of about 2.5 to about 5.0 are respectively measured, two colors are recognized as the same color.

When the color difference $\Delta E^*_{ab}$ is greater than about 2.5, two color are determined as deterioration which is recognizable with an naked eye such as more than two stains.

The deterioration such as a stain of the OLED display device 110 can be minimized using the color difference $\Delta E^*_{ab}$ of the CIE 1976 L*a*b* color coordinate.

FIGS. 9A to 9D are views showing lighting photographs and color difference maps of third to sixth samples of an organic light emitting diode display device according to the first embodiment of the present disclosure.

In FIGS. 9A to 9D, since third to sixth samples of the OLED display device 110 according to the first embodiment of the present disclosure include a plurality of microlenses ML of different shapes, the third to sixth samples have different display qualities.

Figure 9A:
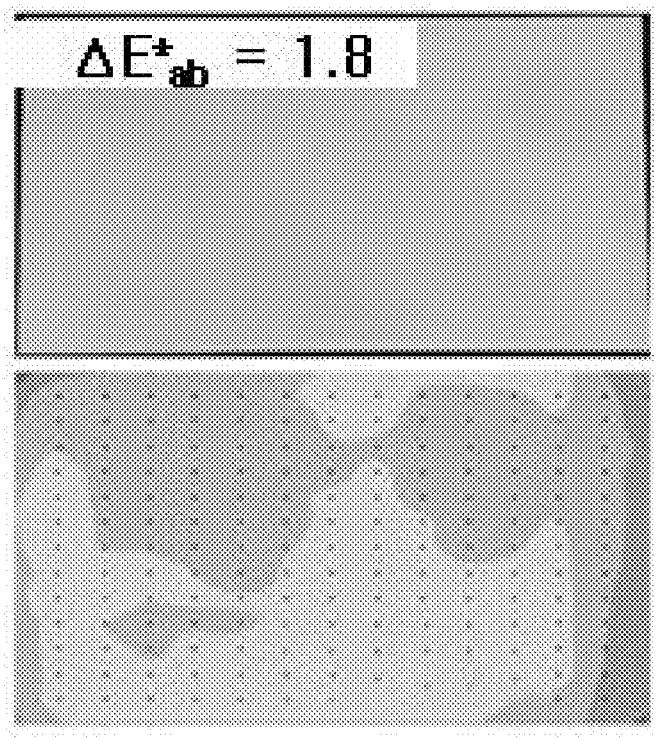
FIGS. 9A to 9D are views showing lighting photographs and color difference maps of third to sixth samples of an organic light emitting diode display device according to the first embodiment of the present disclosure.

In FIG. 9A, the third sample of the OLED display device 110 has a maximum color difference $\Delta E^*_{ab}$ of about 1.8 in a whole of the color difference map, and deterioration such as a stain is not detected in the lighting photograph. As a result, reduction of a display quality is prevented.

Figure 9B:
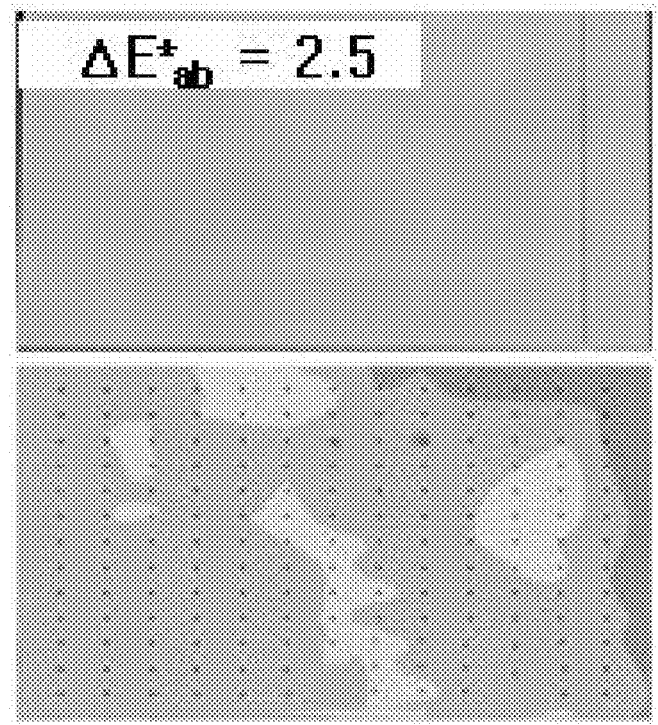

In FIG. 9B, the fourth sample of the OLED display device 110 has a maximum color difference $\Delta E^*_{ab}$ of about 2.5 in a whole of the color difference map, and deterioration such as a stain is not detected in the lighting photograph. As a result, reduction of a display quality is prevented.

Figure 9C:
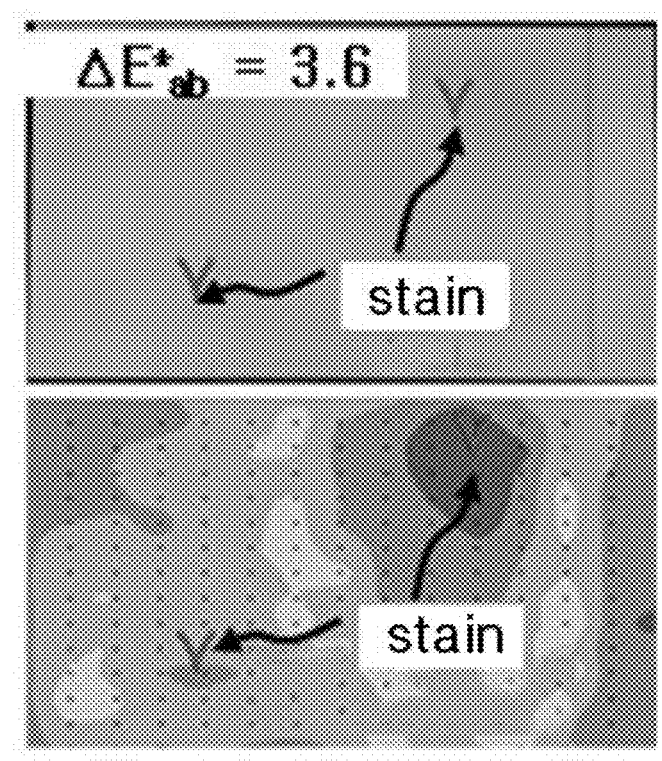

In FIG. 9C, the fifth sample of the OLED display device 110 has a maximum color difference $\Delta E^*_{ab}$ of about 3.6 in a whole of the color difference map, and deterioration such as a stain is detected at two points of the lighting photograph. As a result, a display quality is deteriorated.

Figure 9D:
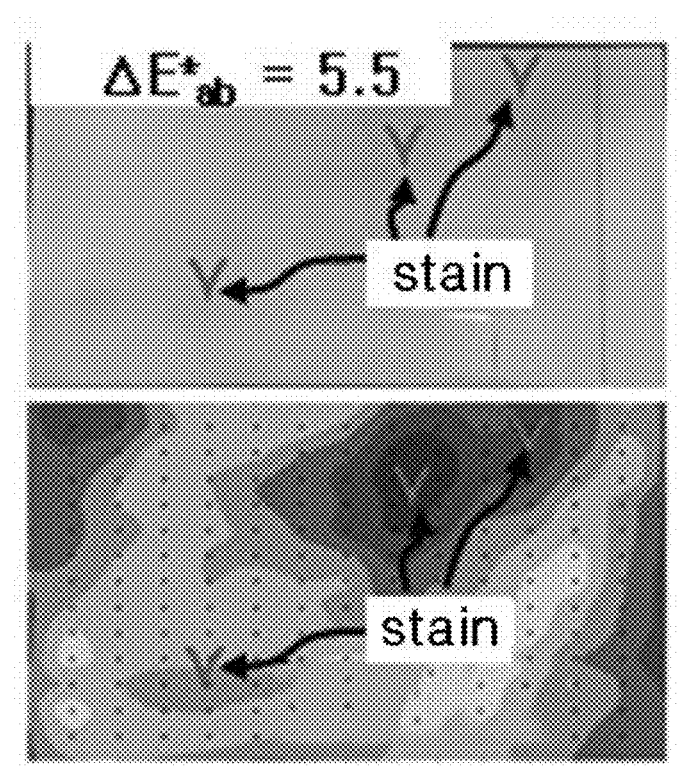

In FIG. 9D, the sixth sample of the OLED display device 110 has a maximum color difference $\Delta E^*_{ab}$ of about 5.5 in a whole of the color difference map, and deterioration such as a stain is detected at three points of the lighting photograph. As a result, a display quality is deteriorated.

In the OLED display device according to the first embodiment of the present disclosure, deterioration such as a stain is minimized using the color difference $\Delta E^*_{ab}$ in the CIE 1976 L*a*b* color coordinate, and reduction of a display quality is prevented.

A light extraction efficiency and a color difference $\Delta E^*_{ab}$ can be controlled using the maximum peak Rp of the plurality of microlenses ML of the OLED display device 110.

Figure 10:
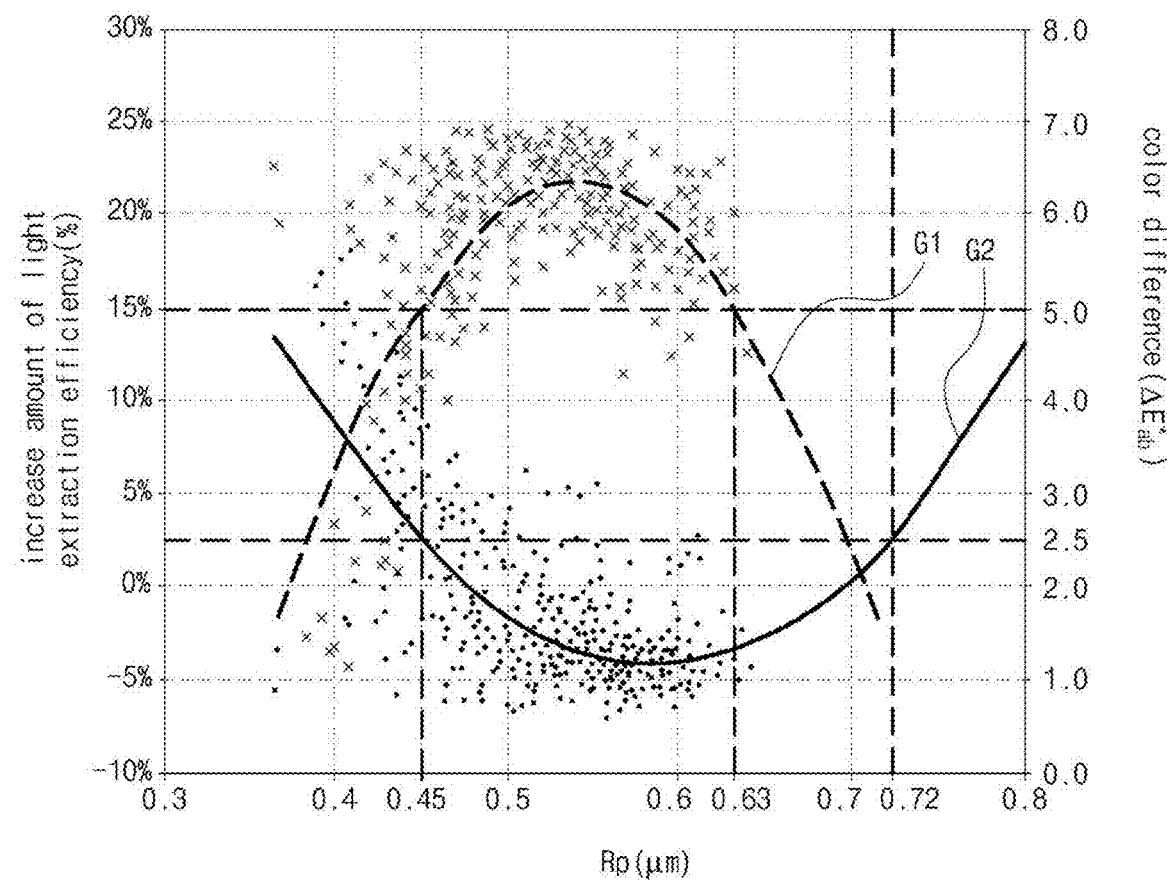
FIG. 10 is a graph showing an increase amount of a light extraction efficiency and a color difference with respect to a maximum peak of an organic light emitting diode display device according to the first embodiment of the present disclosure.

FIG. 10 is a graph showing an increase amount of a light extraction efficiency and a color difference with respect to a maximum peak of an organic light emitting diode display device according to the first embodiment of the present disclosure.

In FIG. 10, an increase amount of a light extraction efficiency and a color difference $\Delta E^*_{ab}$ with respect to a maximum peak Rp (in μm) of a plurality of microlenses ML of the OLED display device according to the first embodiment of the present disclosure are represented by first and second curves G1 and G2. As the maximum peak Rp increases, the increase amount of the light extraction efficiency of the OLED display device 110 having a microlens as compared with an OLED display device having no microlens increases and then decreases, and the color difference $\Delta E^*_{ab}$ decreases and then increases.

As the maximum peak Rp increases, the first and second relative maximum portions 142a and 142d of the plurality of microlenses ML are changed from a round shape to a sharp shape. When the first and second relative maximum portions 142a and 142d of the plurality of microlenses ML have an excessively round shape (nearly flat shape) or an excessively sharp shape, the increase amount of the light extraction efficiency decreases and the color difference $\Delta E^*_{ab}$ increases.

According to the first curve G1, the increase amount of the light extraction efficiency is about 0% when the maximum peak Rp is equal to or greater than about 0.38, and the increase amount of the light extraction efficiency is about 15% when the maximum peak Rp is within a range of about 0.45 μm to about 0.63 μm.

According to the second curve G2, the color difference $\Delta E^*_{ab}$ is equal to or smaller than about 2.5 when the maximum peak Rp is within a range of about 0.45 μm to about 0.72 μm.

When the color difference $\Delta E^*_{ab}$ is greater than about 2.5, the OLED display device 110 can be judged as deterioration having stains at two or more points. As a result, deterioration such as a stain is prevented and the light extraction efficiency is improved by forming the plurality of microlenses ML to have a maximum peak Rp within a range of about 0.45 to about 0.72, where the color difference $\Delta E^*_{ab}$ is smaller than about 2.5.

When the maximum peak Rp of the plurality of microlenses ML is smaller than about 0.45 μm or greater than about 0.72 μm, the color difference $\Delta E^*_{ab}$ is greater than about 2.5 and the OLED display device can have deterioration such as stains at two or more points.

The increase amount of the light extraction efficiency equal to or greater than about 15% offsets an increase of a cost and a decrease of an yield for forming the plurality of microlenses ML. As a result, deterioration such as a stain is prevented and the light extraction efficiency is further improved by forming the plurality of microlenses ML to have a maximum peak Rp within a range of about 0.45 μm to about 0.63 μm, where the increase amount of the light extraction efficiency is equal to or greater than about 15%.

When the maximum peak Rp of the plurality of microlenses ML is smaller than about 0.45 μm or greater than about 0.63 μm, the increase amount of the light extraction efficiency is smaller than about 15%, and an effect of improvement of the light extraction efficiency may not offset an increase of a cost and a decrease of an yield.

In the OLED display device 110 according to the first embodiment of the present disclosure, the central surface CS and the maximum peak Rp are calculated from the plurality of points of the plurality of microlenses ML of the sampling area SA, and the shape of the plurality of microlenses ML, the light extraction efficiency and the color difference $\Delta E^*_{ab}$ are adjusted using the maximum peak Rp. As a result, a reliability of a data increases, the light extraction efficiency is improved, and deterioration such as a stain is minimized.

The shape of the plurality of microlenses ML is adjusted using the maximum peak Rp calculated from the plurality of points of the plurality of microlenses ML of the sampling area SA in the first embodiment. The shape of the plurality of microlenses ML can be adjusted using a first aspect ratio (i.e., a relative maximum aspect ratio) calculated from first and second relative maximum portions of four adjacent microlenses ML in another embodiment.

Figure 11:
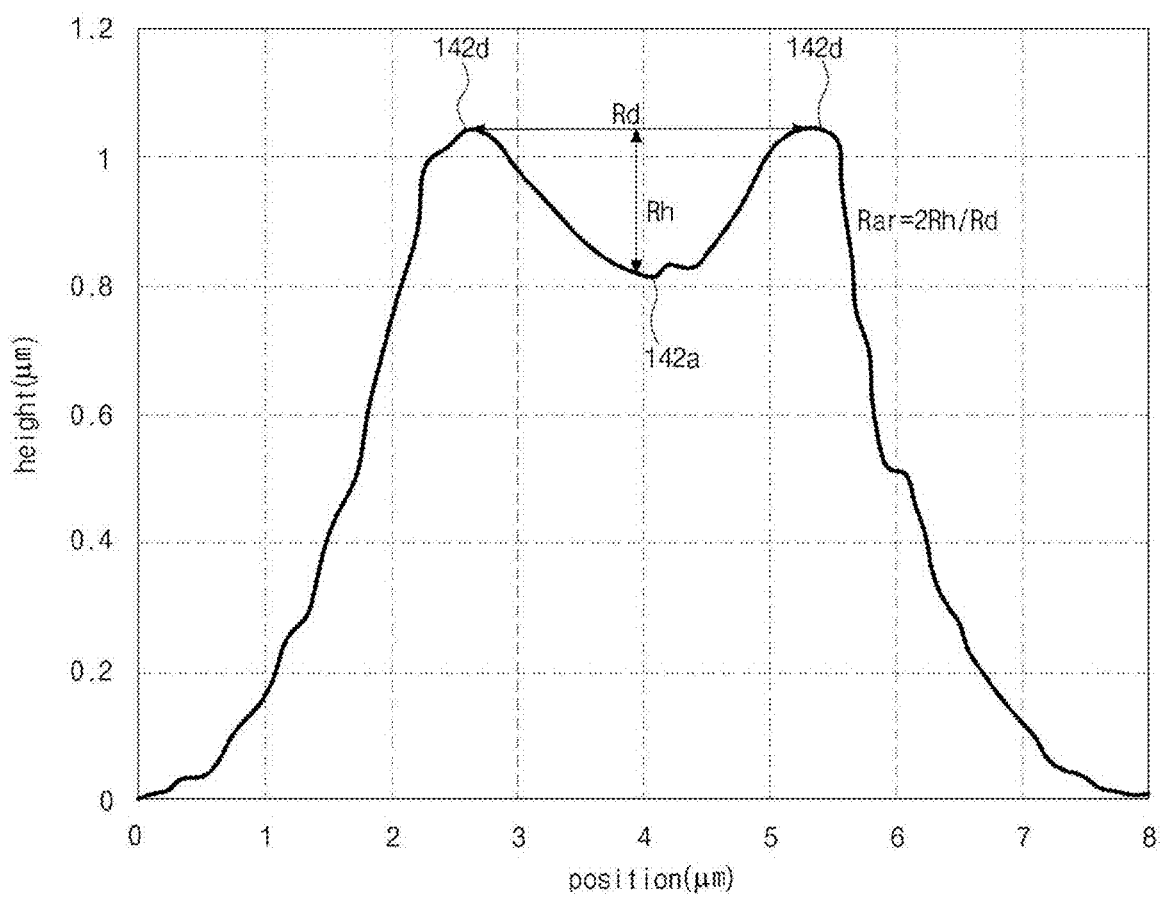
FIG. 11 is a cross-sectional view showing a shape of four adjacent microlenses of an organic light emitting diode display device according to a second embodiment of the present disclosure.

FIG. 11 is a cross-sectional view showing a shape of four adjacent microlenses of an organic light emitting diode display device according to a second embodiment of the present disclosure. The OLED display device of the second embodiment has the same structure as the OLED display device 110 of the first embodiment, and FIG. 11 corresponds to a line of FIG. 2.

In FIG. 11, the OLED display device 110 according to a second embodiment of the present disclosure includes first and second relative maximum portions 142a and 142d. The first relative maximum portion 142a can be disposed between the two adjacent second relative maximum portions 142d.

The two adjacent second relative maximum portions 142d are disposed separated from each other by a first gap distance (i.e., a relative maximum gap distance) Rd, and the second relative maximum portion 142d is disposed higher than the first relative maximum portion 142a by a first height (i.e., a relative maximum height) Rh. A first aspect ratio (i.e., a relative maximum aspect ratio) Rar is defined as a ratio of the first height Rh between the first and second relative maximum portions 142a and 142d with respect to a half of the first gap distance Rd/2 between the first and second relative maximum portions 142a and 142d. (Rar=Rh/(Rd/2)=2Rh/Rd) Shapes of the first and second relative maximum portions 142a and 142d can be adjusted by using the first aspect ratio Rar.

Since the first aspect ratio Rar is changed according to the maximum peak Rp, the shape of the microlens ML can be adjusted using the first aspect ratio Rar.

For example, the maximum peak Rp (in μm) and the first aspect ratio Rar can have a corresponding relationship shown in a following TABLE 1.

TABLE 1

| Rp | 0.35 | 0.4 | 0.455 | 0.5 | 0.55 | 0.6 | 0.64 | 0.69 |
|---|---|---|---|---|---|---|---|---|
| Rar | 0.047 | 0.049 | 0.068 | 0.121 | 0.153 | 0.153 | 0.189 | 0.162 |

As a result, deterioration such as a stain is prevented and the light extraction efficiency is improved by forming the plurality of microlenses ML to have a first aspect ratio (i.e., a relative maximum aspect ratio) Rar within a range of about 0.068 to about 0.189 corresponding to a maximum peak Rp within a range of about 0.45 μm to about 0.72 μm, where the color difference $\Delta E^*_{ab}$ is equal to or smaller than about 2.5.

When the first aspect ratio Rar of the plurality of microlenses ML is smaller than about 0.068 or greater than about 0.189, the color difference $\Delta E^*_{ab}$ is greater than about 2.5 and the OLED display device can have deterioration such as stains at two or more points.

In addition, deterioration such as a stain is prevented and the light extraction efficiency is further improved by forming the plurality of microlenses ML to have a first aspect ratio (i.e., a relative maximum aspect ratio) Rar within a range of about 0.068 to about 0.153 corresponding to a maximum peak Rp within a range of about 0.45 µm to about 0.63 µm, where the increase amount of the light extraction efficiency is equal to or greater than about 15%.

When the first aspect ratio Rar of the plurality of microlenses ML is smaller than about 0.068 or greater than about 0.153, the increase amount of the light extraction efficiency is smaller than about 15%, and an effect of improvement of the light extraction efficiency may not offset an increase of a cost and a decrease of an yield.

In the OLED display device 110 according to a second embodiment of the present disclosure, the first aspect ratio Rar is calculated from the first and second relative maximum portions 142a and 142d of the four adjacent microlenses ML, and the shape of the plurality of microlenses ML, the light extraction efficiency and the color difference $\Delta E^*_{ab}$ are adjusted using the first aspect ratio Rar. As a result, a reliability of a data increases, the light extraction efficiency is improved, and deterioration such as a stain is minimized.

Consequently, in the OLED display device according to the present disclosure, since the shape of the plurality of microlenses is adjusted using the maximum height of the plurality of relative maximum portions in the sampling area, the light extraction efficiency and the reliability are improved.

In addition, since the shape of the plurality of microlenses is adjusted using the maximum height of the plurality of relative maximum portions in the sampling area, the color difference is reduced, the stain is prevented and the reliability is improved.

The present disclosure also relates to and is not limited to the following aspects.

In the present disclosure, an organic light emitting diode display device includes a substrate including at least one subpixel having a non-emitting area and an emitting area; a thin film transistor in the non-emitting area on the substrate; an overcoating layer on the thin film transistor and having a plurality of microlenses at a top surface of the overcoating layer; and a light emitting diode in the emitting area on the overcoating layer and connected to the thin film transistor, wherein a surface of the plurality of microlenses in a sampling area of the emitting area is divided into a plurality of convex portions and a plurality of concave portions with respect to a central surface, wherein a total volume of the plurality of convex portions with respect to the central surface is equal to a total volume of the plurality of concave portions with respect to the central surface, and wherein a maximum peak of a maximum value among heights of the plurality of convex portions with respect to the central surface is within a range of 0.45 to 0.72.

In the present disclosure, a color difference of a CIE 1976 L*a*b* color coordinate of the light emitting diode is smaller than 2.5.

In the present disclosure, the maximum peak is within a range of 0.45 to 0.63.

In the present disclosure, an increase amount of a light extraction efficiency of the light emitting diode is equal to or greater than 15%.

In the present disclosure, adjacent two of the plurality of microlenses constitute a first relative maximum portion, adjacent three of the plurality of microlenses constitute a second relative maximum portion, a central portion of each of the plurality of microlenses constitutes a relative minimum portion, and a portion between the first relative maximum portion and the central portion and between the second relative maximum portion and the central portion constitutes a slanting portion.

In the present disclosure, the plurality of microlenses are disposed in one line along a horizontal direction and are staggered along a vertical direction and a diagonal direction.

In the present disclosure, the first relative maximum portion is disposed between the two adjacent second relative maximum portions, the two adjacent second relative maximum portions are separated from each other by a relative maximum gap distance, the second relative maximum portion is disposed higher than the first relative maximum portion by a relative maximum height, a ratio of the relative maximum height with respect to a half of the relative maximum gap distance is defined as a relative maximum aspect ratio, and the relative maximum aspect ratio is within a range of 0.068 to 0.189.

In the present disclosure, the relative maximum aspect ratio is within a range of 0.068 to 0.153.

In the present disclosure, the light emitting diode includes a first electrode on the overcoating layer and connected to the thin film transistor; a light emitting layer on the first electrode; and a second electrode on the light emitting layer.

In the present disclosure, the first electrode, the light emitting layer and the second electrode have a same shape as the plurality of microlenses according to a surface shape of the overcoating layer.

In the present disclosure, the organic light emitting diode further includes a bank layer between the first electrode and the light emitting layer and having an opening exposing the first electrode.

In the present disclosure, the plurality of microlenses contacts an edge portion of the bank layer.

In the present disclosure, the organic light emitting diode further includes a passivation layer on the thin film transistor; and a wavelength converting layer between the passivation layer and the overcoating layer.

In the present disclosure, the wavelength converting layer includes one of a color filter layer, a quantum dot and a color filter layer having a quantum dot.

In the present disclosure, an edge portion of the bank layer contacts an edge portion of the wavelength converting layer.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode display device, comprising:
    a substrate including at least one subpixel having a non-emitting area and an emitting area;
    a thin film transistor in the non-emitting area on the substrate;
    an overcoating layer on the thin film transistor and having a plurality of microlenses at a top surface of the overcoating layer; and
    a light emitting diode in the emitting area on the overcoating layer and connected to the thin film transistor,
    wherein a surface of the plurality of microlenses is divided into a plurality of convex portions and a plurality of concave portions with respect to a central surface,
    wherein each of the plurality of microlenses has a hexagonal shape in a plan view, wherein the an interface of adjacent two of the plurality of microlenses constitute a linear edge portion, and a first high portion is disposed at a central portion of the linear edge portion, wherein a focal point of adjacent three of the plurality of microlenses constitute a second high portion, and wherein the second high portion is disposed higher than the first high portion.

2. The organic light emitting diode display device of claim 1, wherein the plurality of microlenses have a hexagonal honeycomb structure in a plan view, and wherein apexes of the hexagonal shapes of adjacent three of the plurality of microlenses constitute the second high portion.

3. The organic light emitting diode display device of claim 1, wherein a central portion of each of the plurality of microlenses constitutes a low portion, and wherein a portion between the first high portion and the central portion and between the second high portion and the central portion constitutes a slanting portion.

4. The organic light emitting diode display device of claim 1, wherein the plurality of microlenses are disposed in one line along a horizontal direction and are staggered along a vertical direction and a diagonal direction.

5. The organic light emitting diode display device of claim 1, wherein the second high portion includes a plurality of second high portions spaced apart from each other, and wherein the first high portion is disposed between the two adjacent second high portions among the plurality of second high portions.

6. The organic light emitting diode display device of claim 5, wherein the two adjacent second high portions are separated from each other by a first gap distance.

7. The organic light emitting diode display device of claim 1, wherein the light emitting diode comprises:

a first electrode on the overcoating layer and connected to the thin film transistor;

a light emitting layer on the first electrode; and a second electrode on the light emitting layer.

8. The organic light emitting diode display device of claim 7, further comprising a bank layer having an opening exposing the first electrode, and wherein the plurality of microlenses contact an edge portion of the bank layer.

9. The organic light emitting diode display device of claim 8, further comprising:

a passivation layer on the thin film transistor; and a wavelength converting layer between the passivation layer and the overcoating layer, wherein the wavelength converting layer includes one of a color filter layer, a quantum dot, and a color filter layer having a quantum dot.

10. The organic light emitting diode display device of claim 9, wherein an edge portion of the bank layer overlaps with an edge portion of the wavelength converting layer.

11. The organic light emitting diode display device of claim 8, wherein at least one of the plurality of microlenses is disposed under a portion of the bank layer.

12. The organic light emitting diode display device of claim 1, wherein a total volume of the plurality of convex portions with respect to the central surface is equal to a total volume of the plurality of concave portions with respect to the central surface, and wherein a maximum peak which is a maximum value among heights of the plurality of convex portions with respect to the central surface is within a range of approximately 0.45 µm to 0.72 µm.

13. An organic light emitting diode display device, comprising:

a substrate;

a thin film transistor on the substrate;

an overcoating layer on the thin film transistor and having a plurality of microlenses; and a light emitting diode on the overcoating layer and connected to the thin film transistor, wherein a surface of the plurality of microlenses of the emitting area is divided into a plurality of convex portions and a plurality of concave portions with respect to a central surface, wherein each of the plurality of microlenses has a hexagonal shape in a plan view, wherein an interface of adjacent two of the plurality of microlenses constitute linear edge portion, and a first high portion is disposed at a central portion of the linear edge portion, and wherein a focal point of adjacent three of the plurality of microlenses constitute a second high portion.

14. The organic light emitting diode display device of claim 13, wherein the plurality of microlenses have a hexagonal honeycomb structure in a plan view, and wherein apexes of the hexagonal shapes of adjacent three of the plurality of microlenses constitute the second high portion.

15. The organic light emitting diode display device of claim 13, wherein the plurality of microlenses are disposed in one line along a horizontal direction and are staggered along a vertical direction and a diagonal direction.

16. The organic light emitting diode display device of claim 13, wherein a central portion of each of the plurality of microlenses constitutes a low portion.

17. The organic light emitting diode display device of claim 16, wherein a portion between the first high portion and the central portion and between the second high portion and the central portion constitutes a slanting portion.

18. The organic light emitting diode display device of claim 13, wherein the light emitting diode comprises:

a first electrode on the overcoating layer and connected to the thin film transistor;

a light emitting layer on the first electrode; and a second electrode on the light emitting layer.

19. The organic light emitting diode display device of claim 18, further comprising a bank layer having an opening exposing the first electrode, and wherein the plurality of microlenses contact an edge portion of the bank layer.

20. The organic light emitting diode display device of claim 19, further comprising:

a passivation layer on the thin film transistor; and a wavelength converting layer between the passivation layer and the overcoating layer, wherein the wavelength converting layer includes one of a color filter layer, a quantum dot, and a color filter layer having a quantum dot.

21. The organic light emitting diode display device of claim 20, wherein an edge portion of the bank layer overlaps with an edge portion of the wavelength converting layer.

* * * * *